(12) United States Patent
Zhao et al.

(10) Patent No.: US 8,885,349 B2
(45) Date of Patent: Nov. 11, 2014

(54) DAUGHTER CIRCUIT BOARD FOR INTERFACE SIGNAL CONVERSION

(71) Applicant: Zhongshan Broad-Ocean Motor Co., Ltd., Zhongshan (CN)

(72) Inventors: Yong Zhao, Zhongshan (CN); Xiansheng Zhang, Zhongshan (CN)

(73) Assignee: Zhongshan Broad-Ocean Motor Co., Ltd., Zhongshan (CN)

( * ) Notice: Subject to any disclaimer, the term of this patent is extended or adjusted under 35 U.S.C. 154(b) by 132 days.

(21) Appl. No.: 13/736,935

(22) Filed: Jan. 8, 2013

(65) Prior Publication Data

US 2013/0258612 A1   Oct. 3, 2013

Related U.S. Application Data

(63) Continuation-in-part of application No. PCT/CN2012/073340, filed on Mar. 30, 2012.

(51) Int. Cl.

| | |
|---|---|
| *H01K 1/00* | (2006.01) |
| *H01K 1/14* | (2006.01) |
| *H05K 1/18* | (2006.01) |
| *H05K 1/16* | (2006.01) |
| *H02P 6/08* | (2006.01) |
| *H05K 1/14* | (2006.01) |

(52) U.S. Cl.
CPC .. *H05K 1/18* (2013.01); *H02P 6/08* (2013.01); *H05K 1/141* (2013.01); *H05K 1/167* (2013.01)
USPC ............ 361/748; 361/784; 361/785; 361/792

(58) Field of Classification Search
USPC .................................. 361/748, 784, 785, 792
See application file for complete search history.

(56) References Cited

U.S. PATENT DOCUMENTS

| | | | | |
|---|---|---|---|---|
| 6,825,634 | B2 * | 11/2004 | Tatar et al. ..................... | 318/625 |
| 7,848,326 | B1 * | 12/2010 | Leong et al. .................... | 370/392 |
| 8,050,053 | B2 * | 11/2011 | Deck et al. ..................... | 361/803 |
| 8,271,695 | B2 * | 9/2012 | Zhao ............................... | 710/10 |
| 8,650,348 | B2 * | 2/2014 | Zhao .............................. | 710/301 |
| 2003/0156389 | A1 * | 8/2003 | Busse et al. ..................... | 361/736 |
| 2010/0220449 | A1 * | 9/2010 | Yu .................................. | 361/748 |
| 2013/0169200 | A1 * | 7/2013 | Zhao .............................. | 318/255 |
| 2013/0175967 | A1 * | 7/2013 | Zhao .............................. | 318/558 |

\* cited by examiner

*Primary Examiner* — Jenny L Wagner
*Assistant Examiner* — Nathan Milakovich
(74) *Attorney, Agent, or Firm* — Matthias Scholl P.C.; Matthias Scholl

(57) ABSTRACT

A daughter circuit board of a brushless DC motor for interface signal conversion, having circuit units integrated on the daughter circuit and eight ports for communicating with a control system of a user terminal. The daughter circuit board is plugged into a motor controller for signal conversion so that the motor controller communicates with the control system of the user terminal. The eight ports include a signal input port of analog control, a signal port for activating a fan mode, signal ports of speed feedback, a reserved signal port, a port of COM, a port of DC power supply, and a R/T port.

9 Claims, 8 Drawing Sheets

US 8,885,349 B2

DAUGHTER CIRCUIT BOARD FOR INTERFACE SIGNAL CONVERSION

CROSS-REFERENCE TO RELATED APPLICATIONS

This application is a continuation-in-part of International Patent Application No. PCT/CN2012/073340 with an international filing date of Mar. 30, 2012, designating the United States, now pending, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

1. Field of the Invention

The invention relates to a daughter circuit board of a Brushless DC motor (hereinbelow referred to as BLDC motor) for interface signal conversion.

2. Description of the Related Art

As shown in FIGS. 1 and 2, a conventional electronically commutated motor (ECM) includes a main body and a controller. The main body has a stator assembly and a rotor assembly. The controller should correspond with both the main body and a control interface of a control system of a user terminal. Different control systems of user terminals correspond with different control signals. For example, both a control system of an air-conditioner and a control system of a washing-machine belong to control system of user terminals, but the control signals thereof are completely different. Conventionally, for each specific control system of a user terminal, a motor and a controller thereof are developed accordingly, which, however, brings about the following disadvantages: 1) a variety of motors have to be manufactured, which results in inconvenient management and standardization; 2) the development for motors takes time and increases the production costs; and 3) the newly-developed motor has a narrow application scope and is inconvenient for popularization.

To solve the above-described problems, a motor controller including a mother circuit board and a daughter circuit board butted therewith has been introduced. Main functional circuits of the motor controller are disposed on the mother circuit board. Different interface circuit units and identify circuits are disposed on different daughter circuit boards. When one daughter circuit board is butted with the mother circuit board, the identify circuit of the daughter circuit board sends messages to a central control and process unit of the mother circuit board. Thereafter, the central control and process unit automatically assigns an input/output port for the daughter circuit board. Thus, through cooperation with various daughter circuit boards, the motor controller can be applied to various occasions, i.e., has a wide application. Consequently, the motor manufactures do not need to produce a large number of motors, thereby reducing the management and development costs, simplifying the production process, and improving the efficiency.

Specifically, as shown in FIGS. 3-5, a motor controller includes a central control and process unit, an interface circuit unit, and an identify circuit. The central control and process unit is disposed on a mother circuit board. The interface circuit unit and the identify circuit are disposed on a daughter circuit board. The mother circuit board and the daughter circuit board are butted with each other to form an electric connection. The identify circuit inputs an identify signal to the central control and process unit, and then the central control and process unit automatically assigns an input/output port for the interface circuit unit according to the identify signal.

Identify circuits corresponding with different interface circuit units output different signals, whereby forming different daughter circuit boards. An output end of the central control and process unit is connected to a power drive circuit module. An input end of the central control and process unit is connected to an output end of a rotor position sensing circuit. The power drive circuit module and the rotor position sensing circuit are disposed on the mother circuit board. A power supply circuit and an analog sensing circuit are also disposed on the mother circuit board. The power supply circuit supplies power to all the circuits. The central control and process unit is a CPU, a micro control unit (MCU), or a digital signal processor (DSP). A port 3 is disposed on the mother circuit board and includes eleven terminal lugs E, N, L, M1, M2, M3, M4, M5, M6, M7, and M8. There may be a plurality of daughter circuit boards, for example, a first daughter circuit board, a second daughter circuit board, and a third daughter circuit board. A slot 1 is disposed on the mother circuit board, and a plug connector 2 is disposed on the daughter circuit board. The plug connector 2 is received in the slot 1 whereby electrically connecting the daughter circuit board with the mother circuit board.

To standardize the signal mode of daughter circuit boards and benefit the correspondence thereof with various control systems of user terminals, it's necessary to standardize reasonably the daughter circuit boards to form a basically consistent electric standard so as to facilitate management and application.

SUMMARY OF THE INVENTION

In view of the above-described problems, it is one objective of the invention to provide a daughter circuit board of a BLDC motor for interface signal conversion that is simple, easy to correspond with various control systems of user terminals, and accords with the latest electric standard thereby facilitating management and popularization.

To achieve the above objective, in accordance with one embodiment of the invention, there provided is a daughter circuit board of a BLDC motor for interface signal conversion, comprising circuit units integrated on the daughter circuit board and eight ports for communicating with a control system of a user terminal, the daughter circuit board being plugged into a motor controller for signal conversion so that the motor controller communicates with the control system of the user terminal. The eight ports comprise:

M1: a signal input port of analog control, which has a voltage of 9-40 V DC, a frequency of 75-166 Hz, and a current of <10 Ma, signals passing through the port being converted by a first signal conversion circuit of the daughter circuit board;

M2: a signal port for activating a fan mode, signals passing through the port being converted by a second signal conversion circuit of the daughter circuit board;

M3 and M4: signal ports of speed feedback, which are connected to a third signal conversion circuit of the daughter circuit board, and output n pulses per rotation;

M5: a reserved signal port, signals passing through the port being converted by a fourth signal conversion circuit of the daughter circuit board;

M6: a port of component object mode (COM), which is a ground line of signal lines and a common terminal of control signals;

M7: a port of DC power supply, which has a voltage of 8-30 V, and a current of <30 mA; and M8: a R/T port, which is connected to a bidirectional asynchronous half-duplex communication data line of the daughter circuit board, for data transmission between the daughter circuit board and the control system of the user terminal.

In a class of this embodiment, the port M3 is at a low level, and the port M4 is an open collector output.

In a class of this embodiment, the daughter circuit board further comprises an identify circuit, which is a voltage divider circuit comprising serially-connected resistors, one port of the identify circuit is connected to a power supply, another port of the identify circuit is connected to the ground, and an output port BSEL of the indentify circuit is connected to an input port of a micro control unit (MCU) of the motor controller.

In a class of this embodiment, the third signal conversion circuit is connected to a pulse counter.

In a class of this embodiment, signal conversion circuits may be conventional photoelectric coupling circuit units.

In a class of this embodiment, the signals passing through the signal port for activating the fan mode are 24 V AC signals.

Advantages of the invention are summarized below: the daughter circuit board of the invention communicates with a control system of a user terminal using eight ports, which employs a simple electric standard and facilitates corresponding with the control system of the user terminal easily, thereby avoiding involving excessive types of daughter circuit boards and benefitting to manage and popularize.

BRIEF DESCRIPTION OF THE DRAWINGS

The invention is described hereinbelow with reference to accompanying drawings, in which.

DETAILED DESCRIPTION OF THE EMBODIMENTS

For further illustrating the invention, experiments detailing a daughter circuit board for interface signal conversion are described below. It should be noted that the following examples are intended to describe and not to limit the invention.

Figure 1:
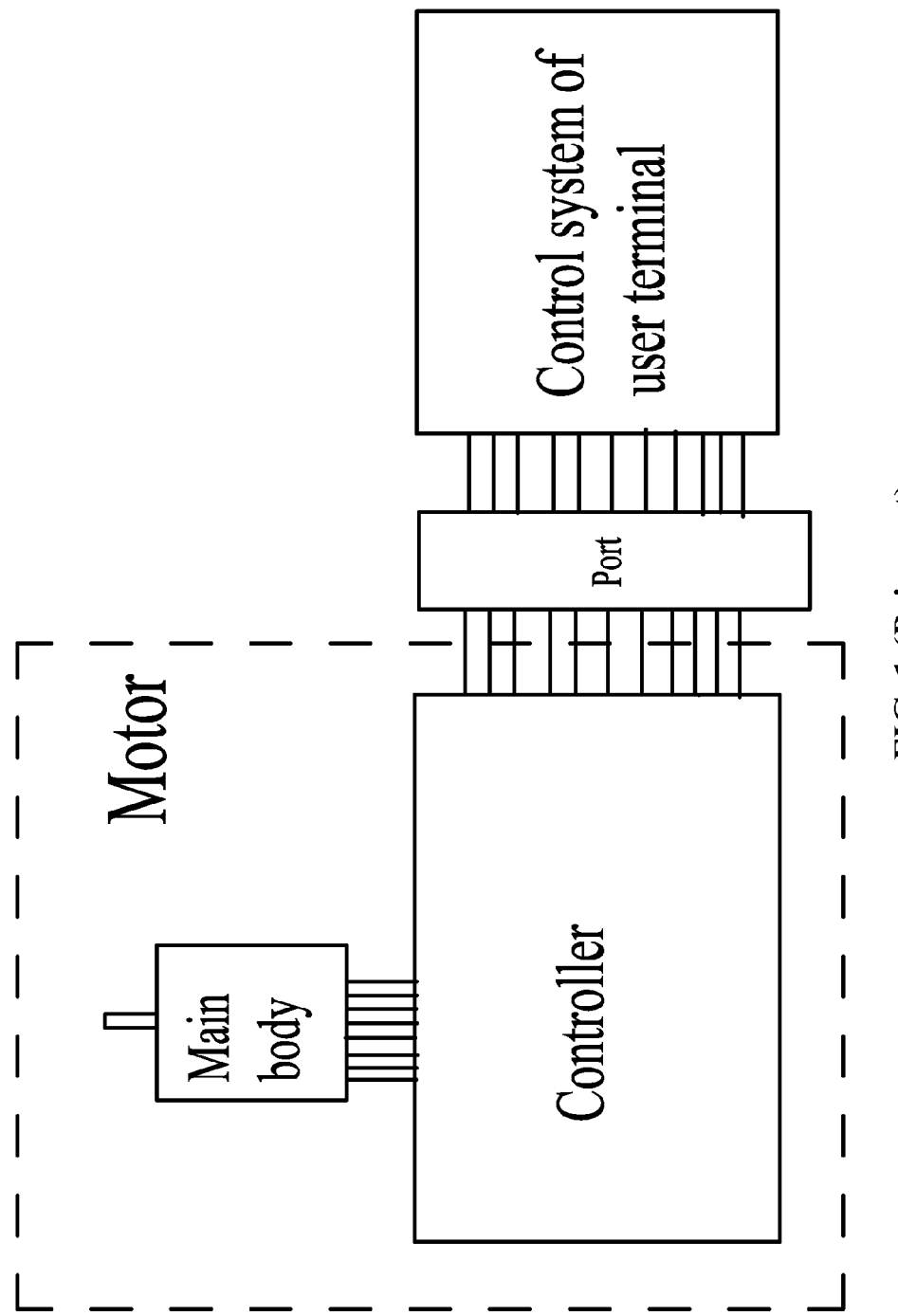
FIG. 1 is a schematic diagram of connection between a motor controller and a control system of a user terminal in the prior art.
Figure 2:
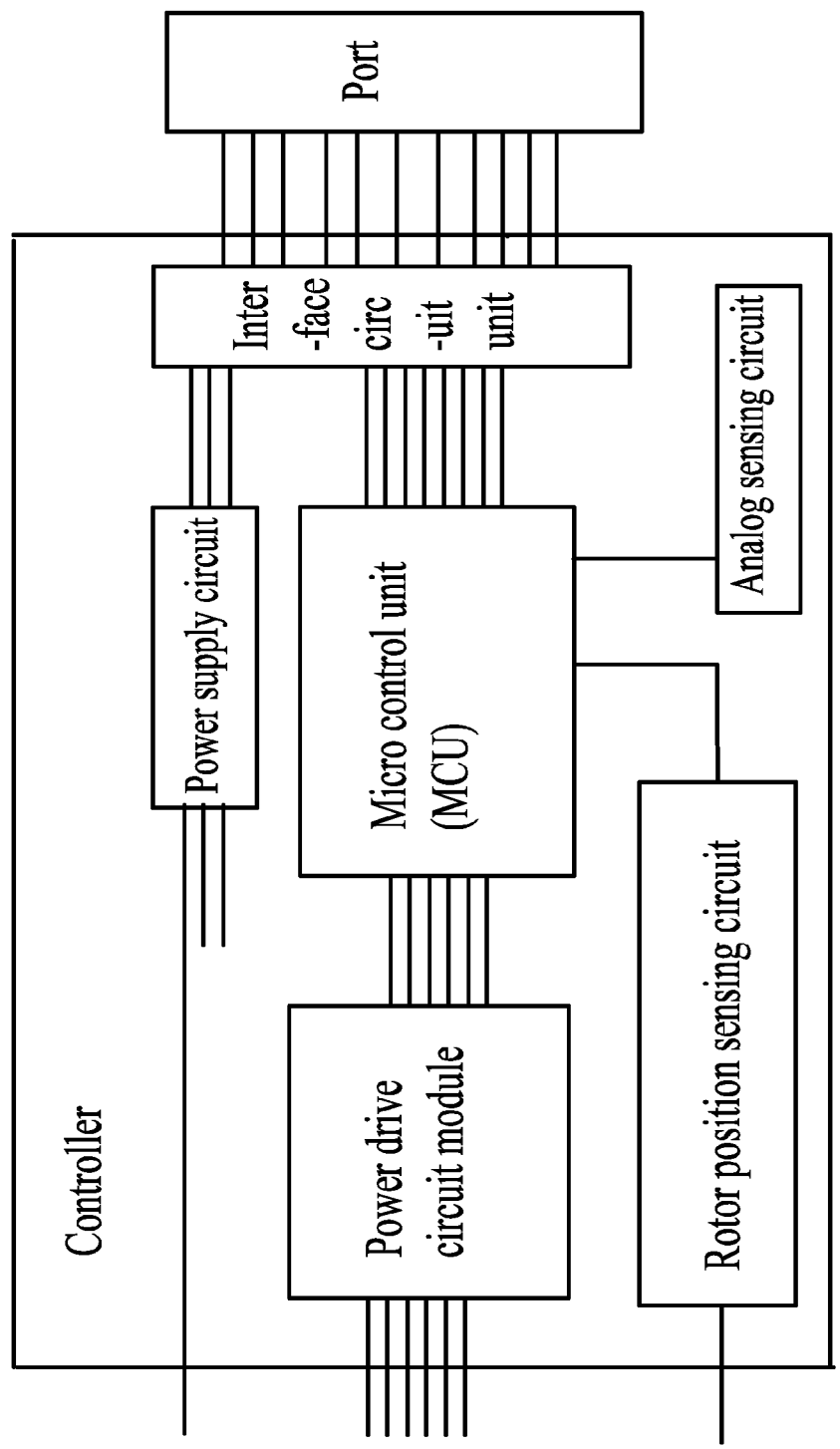
FIG. 2 is a block diagram of a motor controller in the prior art.
Figure 3:
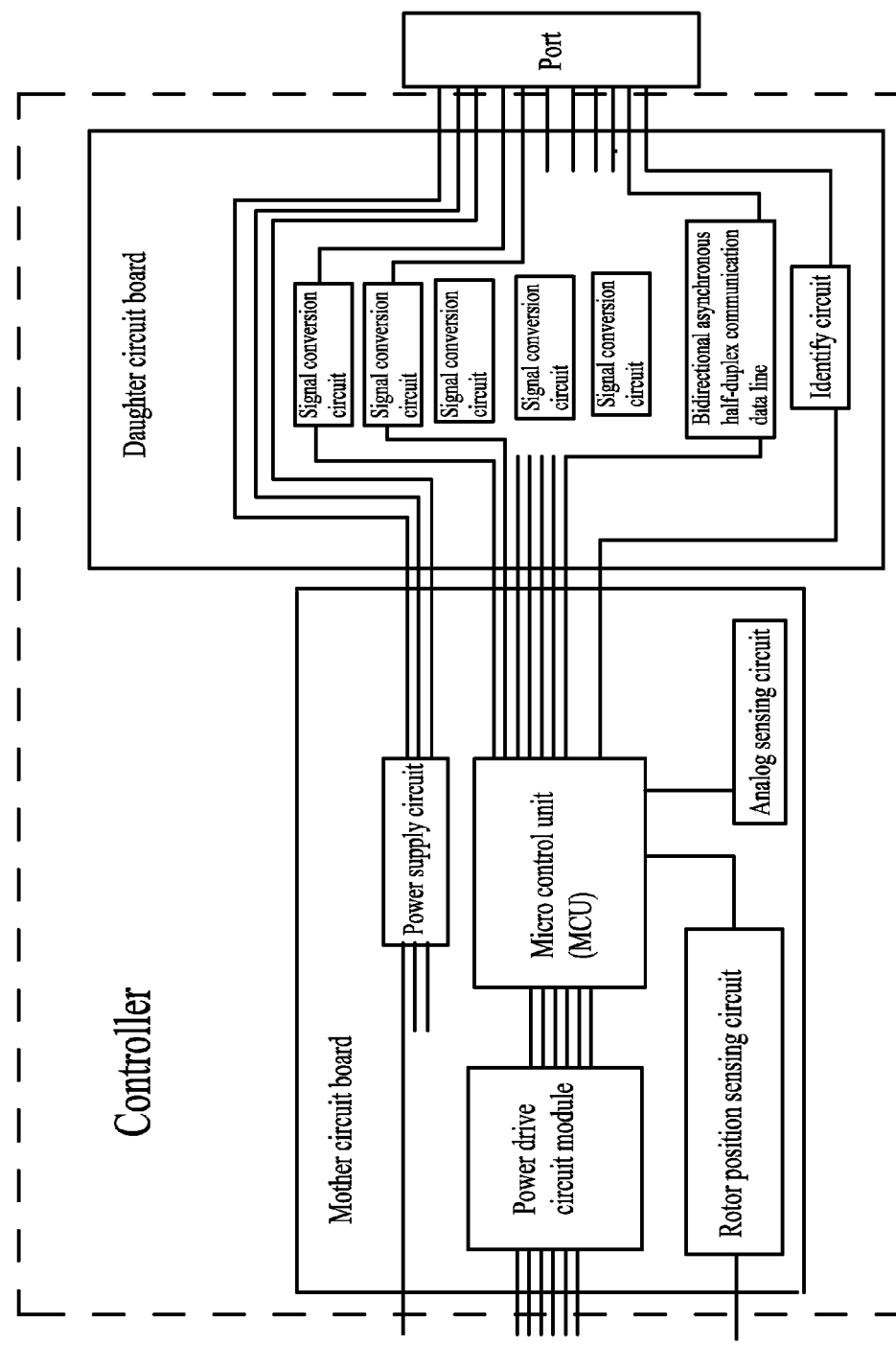
FIG. 3 is a schematic diagram of a motor controller having a mother and a daughter circuit board in the prior art.
Figure 4:
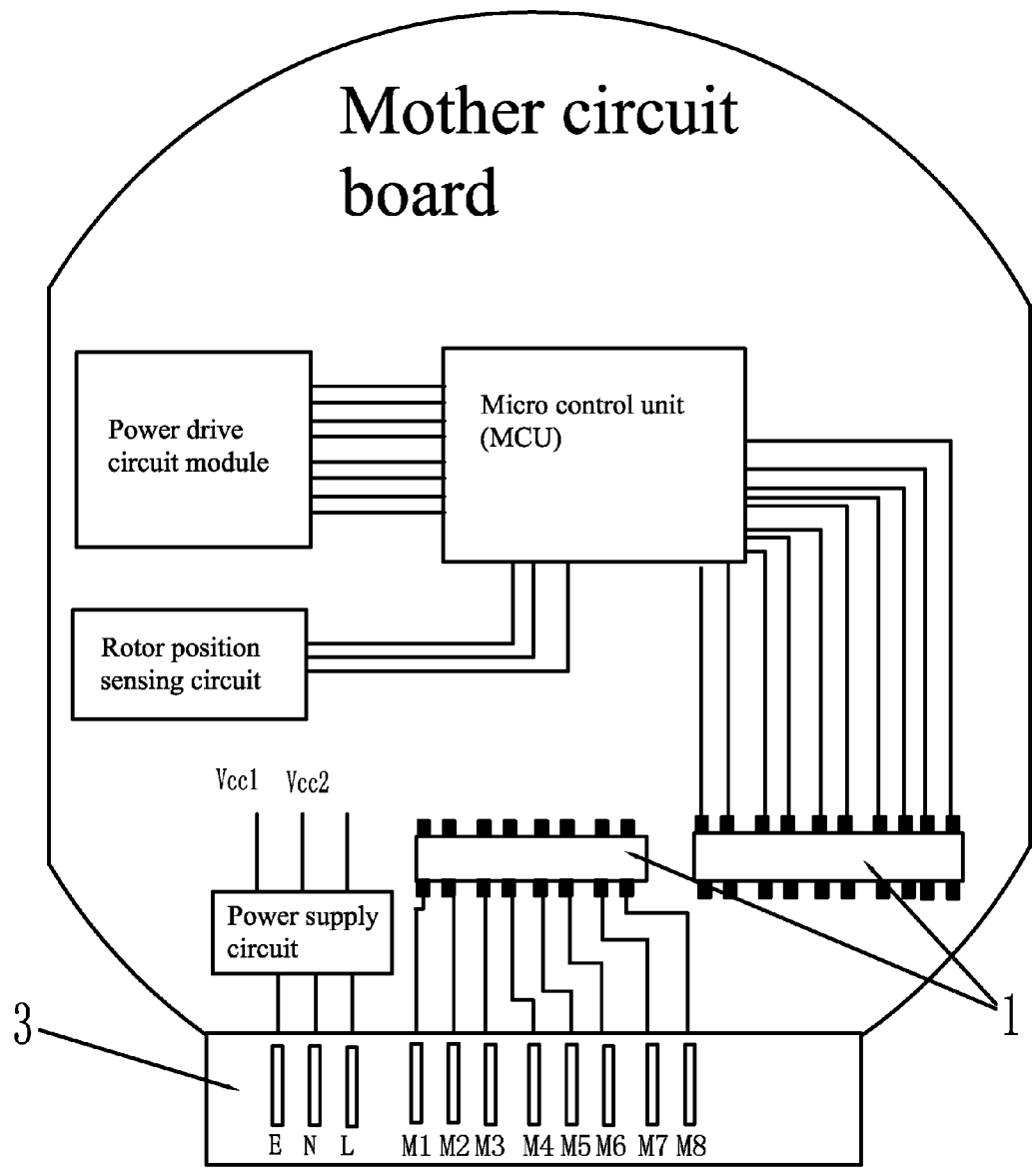
FIG. 4 is a schematic diagram of a mother circuit board of a motor controller in the prior art.
Figure 5:
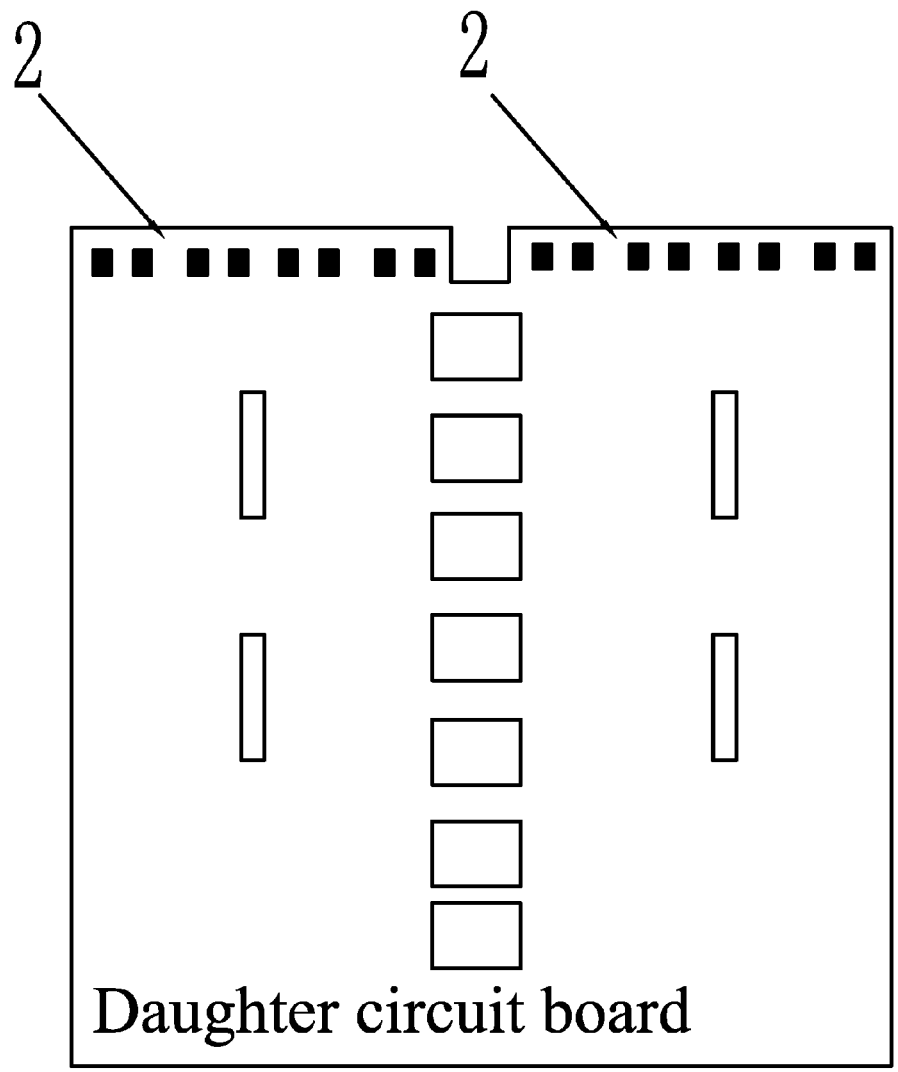
FIG. 5 is a schematic diagram of a daughter circuit board of a motor controller in the prior art.
Figure 6:
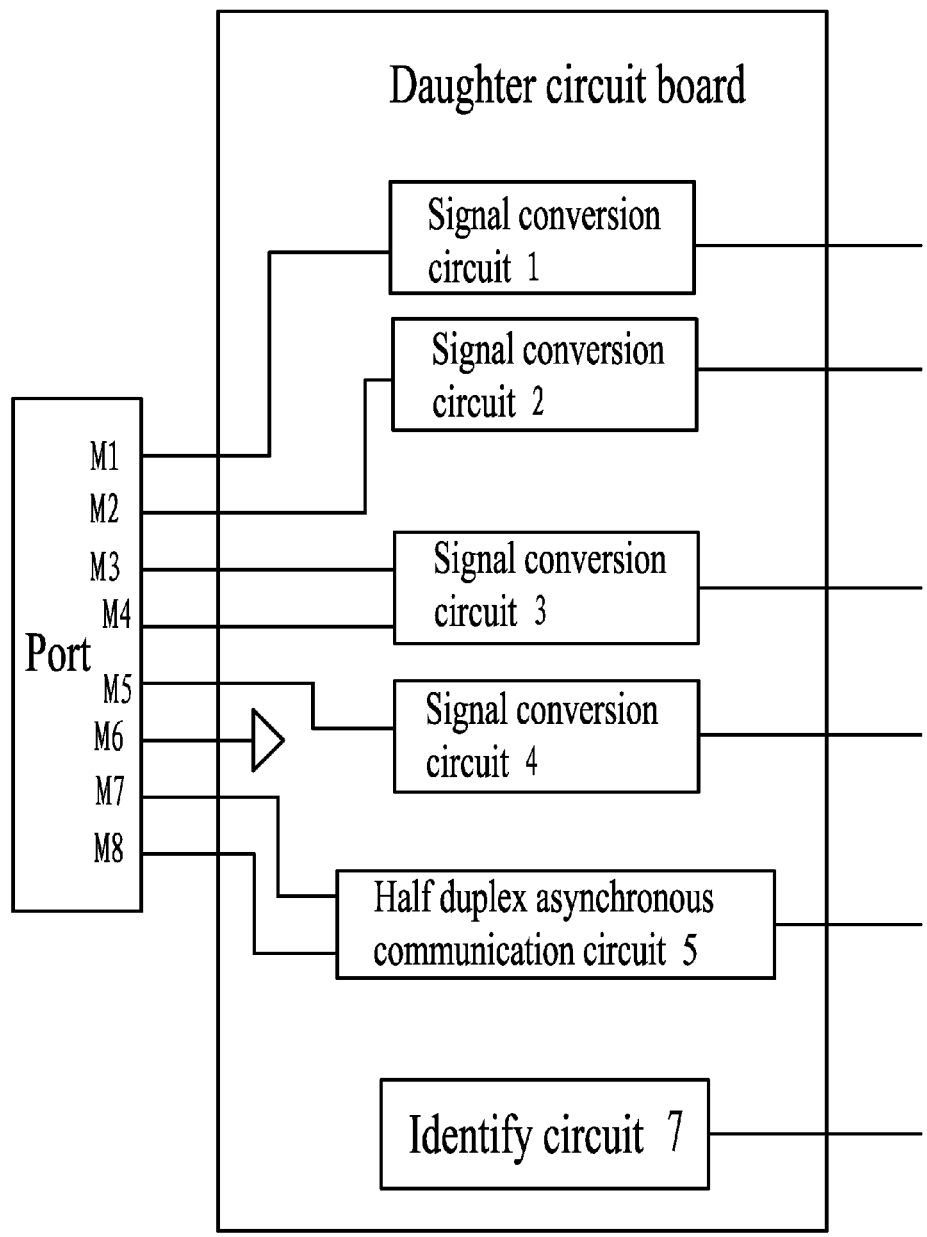
FIG. 6 is a block diagram of a daughter circuit board in accordance with one embodiment of the invention.
Figure 7:
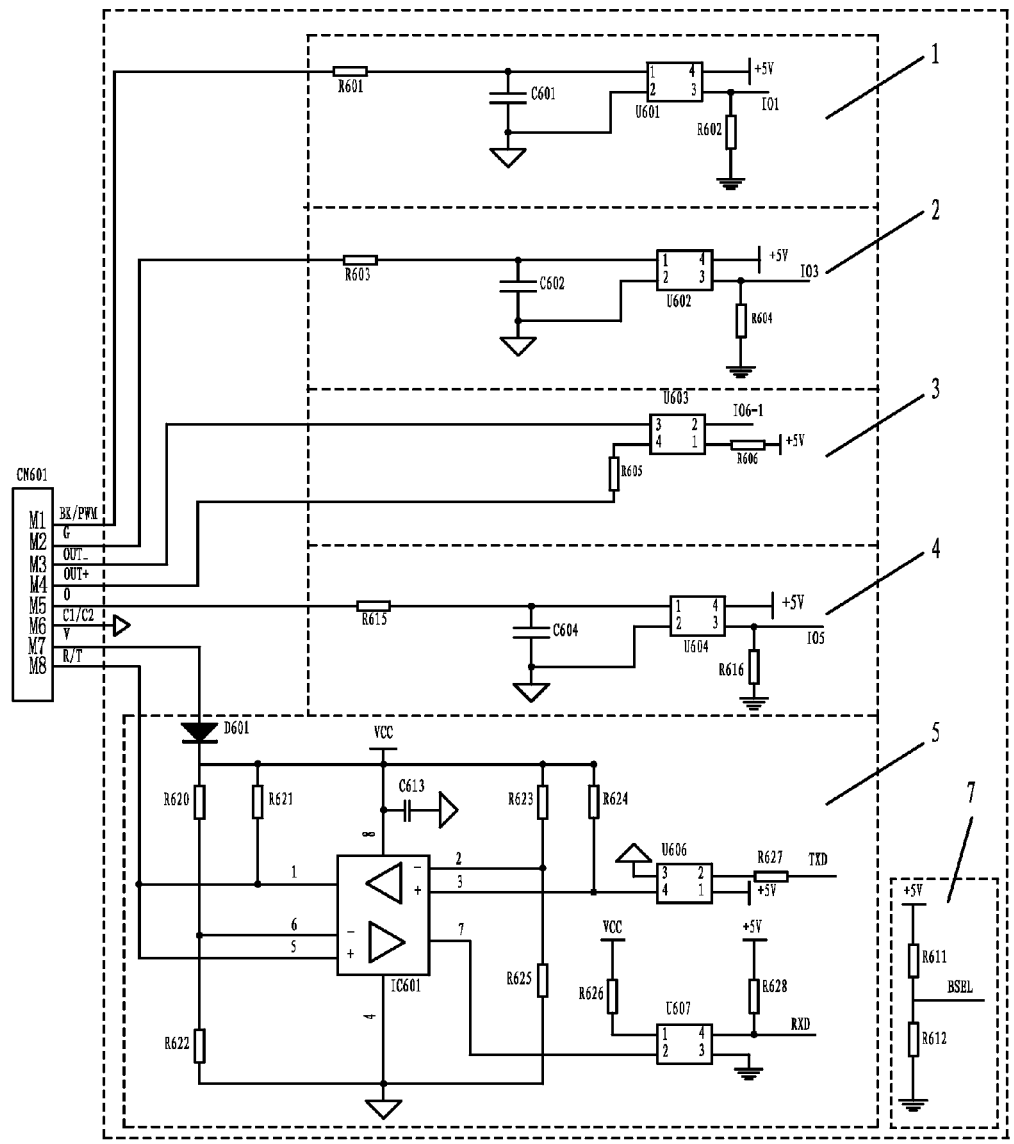
FIG. 7 is a circuit diagram of the daughter circuit board of FIG. 6.
Figure 8:
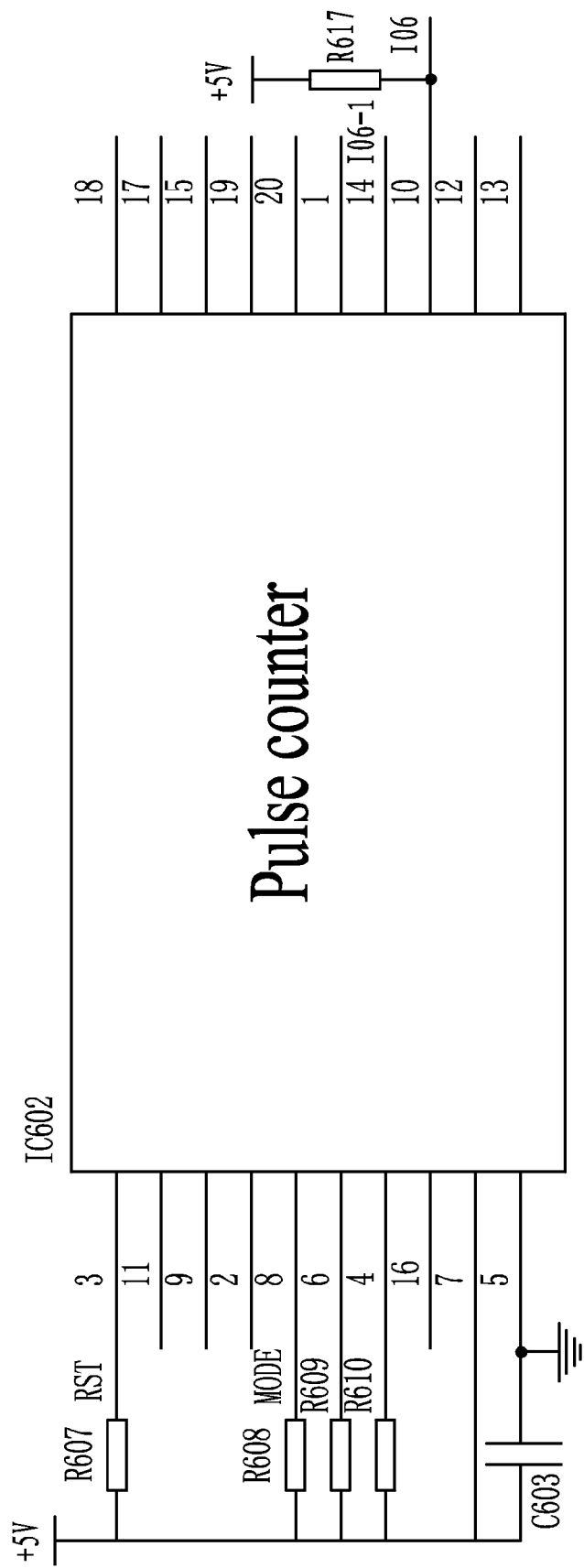
FIG. 8 is a circuit diagram of a pulse counter.

As shown in FIGS. 6-8, a daughter circuit board of a BLDC motor for interface signal conversion, comprises circuit units integrated on the daughter circuit and eight ports for communicating with a control system of a user terminal. The daughter circuit board is plugged into a motor controller for signal conversion so that the motor controller communicates with the control system of the user terminal. The eight ports comprise:

M1: a signal input port of analog control, which has a voltage of 9-40 V DC, a frequency of 75-166 Hz, and a current of <10 Ma, signals passing through the port being converted by a signal conversion circuit 1 of the daughter circuit board;

M2: a signal port for activating a fan mode, signals passing through the port being converted by a signal conversion circuit 2 of the daughter circuit board;

M3 and M4: signal ports of speed feedback, which are connected to a signal conversion circuit 3 of the daughter circuit board, and output n pulses per rotation;

M5: a reserved signal port, signals passing through the port being converted by a signal conversion circuit 4 of the daughter circuit board;

M6: a port of component object mode (COM), which is a ground line of signal lines and a common terminal of control signals;

M7: a port of DC power supply, which has a voltage of 8-30 V, and a current of <30 mA; and M8: a R/T port, which is connected to a bidirectional asynchronous half-duplex communication data line 5 of the daughter circuit board, for data transmission between the daughter circuit board and the control system of the user terminal.

The port M3 is at a low level, and the port M4 is an open collector output. The daughter circuit board further comprises an identify circuit 7, which is a voltage divider circuit comprising serially-connected resistor R611 and resistor 612. One port of the identify circuit 7 is connected to a power supply having a voltage of +5 V, and another port of the identify circuit 7 is connected to the ground. An output port BSEL of the indentify circuit is connected to an input port of a micro control unit (MCU) of the motor controller. The signal conversion circuit 3 is connected to a pulse counter, that is, an interface 106-1 of the signal conversion circuit 3 is connected to an interface 106-1 of the pulse counter. Thus, motor signals are input to the signal conversion circuit through the pulse counter. The signal conversion circuits 1, 2, 3, and 4 may be conventional photoelectric coupling circuit units. The signals passing through the signal port for activating the fan mode are 24 V AC signals.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A daughter circuit board for interface signal conversion, comprising:
    a) a plurality of circuit units integrated on the daughter circuit board; and
    b) eight ports for communicating with a control system of a user terminal;
wherein said eight ports comprise:
    M1: a signal input port of analog control, which has a voltage of 9-40 V DC, a frequency of 75-166 Hz, and a current of <10 Ma, and signals passing through the port being converted by a first signal conversion circuit (1) of the daughter circuit board;

M2: a signal port for activating a fan mode, signals passing through the port being converted by a second signal conversion circuit (2) of the daughter circuit board;

M3 and M4: signal ports of speed feedback, which are connected to a third signal conversion circuit (3) of the daughter circuit board, and output n pulses per rotation;

M5: a reserved signal port, signals passing through the port being converted by a fourth signal conversion circuit (4) of the daughter circuit board;

M6: a port of component object mode (COM), which is a ground line of signal lines and a common terminal of control signals;

M7: a port of DC power supply, which has a voltage of 8-30 V, and a current of <30 mA; and M8: a R/T port, which is connected to a bidirectional asynchronous half-duplex communication data line (5) of the daughter circuit board, for data transmission between the daughter circuit board and the control system of the user terminal.

2. The daughter circuit board of claim 1, wherein the port M3 is at a low level, and the port M4 is an open collector output.

3. The daughter circuit board of claim 1, further comprising an identify circuit (7), wherein the identify circuit (7) is a voltage divider circuit comprising serially-connected resistors;

one port of the identify circuit (7) is connected to a power supply, another port of the identify circuit (7) is connected to the ground; and an output port BSEL of the indentify circuit is connected to an input port of a micro control unit (MCU) of the motor controller.

4. The daughter circuit board of claim 1, wherein the third signal conversion circuit (3) is connected to a pulse counter.

5. The daughter circuit board of claim 1, wherein the first, second, third, and fourth signal conversion circuits (1), (2), (3), and (4) are conventional photoelectric coupling circuit units.

6. The daughter circuit board of claim 2, wherein the first, second, third, and fourth signal conversion circuits (1), (2), (3), and (4) are conventional photoelectric coupling circuit units.

7. The daughter circuit board of claim 3, wherein the first, second, third, and fourth signal conversion circuits (1), (2), (3), and (4) are conventional photoelectric coupling circuit units.

8. The daughter circuit board of claim 4, wherein the first, second, third, and fourth signal conversion circuits (1), (2), (3), and (4) are conventional photoelectric coupling circuit units.

9. The daughter circuit board of claim 1, wherein the signals passing through the signal port for activating the fan mode are 24 V AC signals.

\* \* \* \* \*